(12) United States Patent
Baloglu et al.

(10) Patent No.: US 10,861,798 B2
(45) Date of Patent: *Dec. 8, 2020

(54) EMBEDDED VIBRATION MANAGEMENT SYSTEM HAVING AN ARRAY OF VIBRATION ABSORBING STRUCTURES

(71) Applicant: Amkor Technology, Inc., Tempe, AZ (US)

(72) Inventors: Bora Baloglu, Chandler, AZ (US); Adrian Arcedera, Chandler, AZ (US); Marc Alan Mangrum, Manchaca, TX (US); Russell Shumway, Mesa, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/043,645

(22) Filed: Jul. 24, 2018

(65) Prior Publication Data
US 2018/0374800 A1    Dec. 27, 2018

Related U.S. Application Data

(63) Continuation of application No. 14/069,814, filed on Nov. 1, 2013, now Pat. No. 10,032,726.

(51) Int. Cl.
*H01L 23/16* (2006.01)
*H01L 23/00* (2006.01)
(Continued)

(52) U.S. Cl.
CPC .............. *H01L 23/562* (2013.01); *B81B 1/00* (2013.01); *B81B 7/0058* (2013.01); *H01L 23/16* (2013.01);
(Continued)

(58) Field of Classification Search
CPC ... H01L 21/563; H01L 23/562; H01L 23/495; H01L 23/49861; H01L 2924/1461; H01L 2924/181; H01L 2924/3512; B81B 7/0058; B81B 7/0048
See application file for complete search history.

(56) References Cited

U.S. PATENT DOCUMENTS

| 6,021,670 | A | * | 2/2000 | Takeuchi | .............. | B81B 7/0058 |
| | | | | | | 73/493 |
| 7,049,171 | B2 | * | 5/2006 | Brauer | ................... | H01L 23/562 |
| | | | | | | 257/E21.509 |

(Continued)

*Primary Examiner* — Khiem D Nguyen
(74) *Attorney, Agent, or Firm* — McAndrews, Held & Malloy, Ltd.

(57) ABSTRACT

Methods for an embedded vibration management system are disclosed and may include fabricating a semiconductor package that supports vibration management by forming an array of vibration absorbing structures, placing the array proximate to a leadframe comprising two-legged supported leads, placing a semiconductor device above the leadframe, and encapsulating the semiconductor device and the leadframe. Each vibration absorbing structure may comprise a mass element formed on a material with lower density than that of the mass element. The array may be placed on a top, a bottom, or both surfaces of the leadframe. Sections of the array may be placed symmetrically with respect to the semiconductor device. The vibration absorbing structures may be cubic in shape and may be enclosed in an encapsulating material. The two-legged supported leads may be formed by bending metal strips with holes. The vibration absorbing structures may be exposed to the exterior of the semiconductor package.

20 Claims, 9 Drawing Sheets

(51) Int. Cl.
*H01L 23/495* (2006.01)
*B81B 7/00* (2006.01)
*B81B 1/00* (2006.01)
*H01L 23/31* (2006.01)

(52) U.S. Cl.
CPC ............ H01L 23/495 (2013.01); H01L 24/96 (2013.01); *H01L 23/3107* (2013.01); *H01L 2924/1433* (2013.01); *H01L 2924/1461* (2013.01); *H01L 2924/1815* (2013.01); *H01L 2924/19105* (2013.01); *H01L 2924/351* (2013.01)

(56) References Cited

U.S. PATENT DOCUMENTS

| | | | | |
|---|---|---|---|---|
| 7,564,122 B2 * | 7/2009 | Yee | ................... | H01L 23/3107 257/666 |
| 8,618,620 B2 * | 12/2013 | Winkler | ................ | G01L 9/0054 257/415 |
| 10,032,726 B1 * | 7/2018 | Baloglu | ................ | H01L 23/562 |
| 2007/0278632 A1 * | 12/2007 | Zhao | ................... | H01L 23/4334 257/676 |
| 2009/0051016 A1 * | 2/2009 | Galesic | ................... | H01L 23/24 257/669 |
| 2011/0010924 A1 * | 1/2011 | Berger | ................. | B81B 7/0058 29/592.1 |
| 2011/0167912 A1 * | 7/2011 | Ohta | .................... | B81B 7/0058 73/504.12 |
| 2013/0140655 A1 * | 6/2013 | Yeh | ........................ | H01L 21/56 257/416 |
| 2013/0277815 A1 * | 10/2013 | Lee | ......................... | H01L 21/56 257/676 |
| 2014/0217566 A1 * | 8/2014 | Goida | .................... | H01L 23/04 257/676 |
| 2014/0302640 A1 * | 10/2014 | Qin | ........................ | H01L 24/97 438/108 |

* cited by examiner

EMBEDDED VIBRATION MANAGEMENT SYSTEM HAVING AN ARRAY OF VIBRATION ABSORBING STRUCTURES

CROSS-REFERENCE TO RELATED APPLICATIONS/INCORPORATION BY REFERENCE

The present application is a continuation of U.S. spplication Ser. No. 14/069,814, filed Nov. 1, 2013, titled "AN EMBEDDED VIBRATION MANAGEMENT SYSTEM," issued as U.S. Pat. No. 10,032,726 on Jul. 24, 2018, which is hereby incorporated herein by reference in its entirety.

FIELD

Certain embodiments of the disclosure relate to semiconductor chip packaging. More specifically, certain embodiments of the disclosure relate to an embedded vibration management system.

BACKGROUND

Semiconductor packaging protects integrated circuits, or chips, from physical damage and external stresses. In addition, it can provide a thermal conductance path to efficiently remove heat generated in a chip, and also provide electrical connections to other components such as printed circuit boards, for example. Materials used for semiconductor packaging typically comprise ceramic or plastic, and form-factors have progressed from ceramic flat packs and dual in-line packages to pin grid arrays and leadless chip carrier packages, among others.

Further limitations and disadvantages of conventional and traditional approaches will become apparent to one of skill in the art, through comparison of such systems with the present disclosure as set forth in the remainder of the present application with reference to the drawings.

DETAILED DESCRIPTION

Certain aspects of the disclosure may be found in semiconductor package having an embedded or integrated vibration management system. Example aspects of the disclosure may comprise fabricating a semiconductor package, where the fabricating comprises: forming an array of vibration absorbing structures; placing the array of vibration absorbing structures proximate to a leadframe comprising two-legged supported leads; placing a semiconductor device above the leadframe; and encapsulating the semiconductor device and the leadframe. Each vibration absorbing structure may comprise a mass element formed on a material with lower density than the material of the mass element. The array of vibration absorbing structures may be placed on a top surface, on a bottom surface or both the top and bottom surfaces of the leadframe. Sections of the array of vibration absorbing structures may be placed symmetrically with respect to the semiconductor device. The vibration absorbing structures may be cubic in shape. The vibration absorbing structures may be enclosed in an encapsulating material. The two-legged supported leads may be formed by bending metal strips with holes. The vibration absorbing structures may be exposed to the exterior of the semiconductor package.

Figure 1:
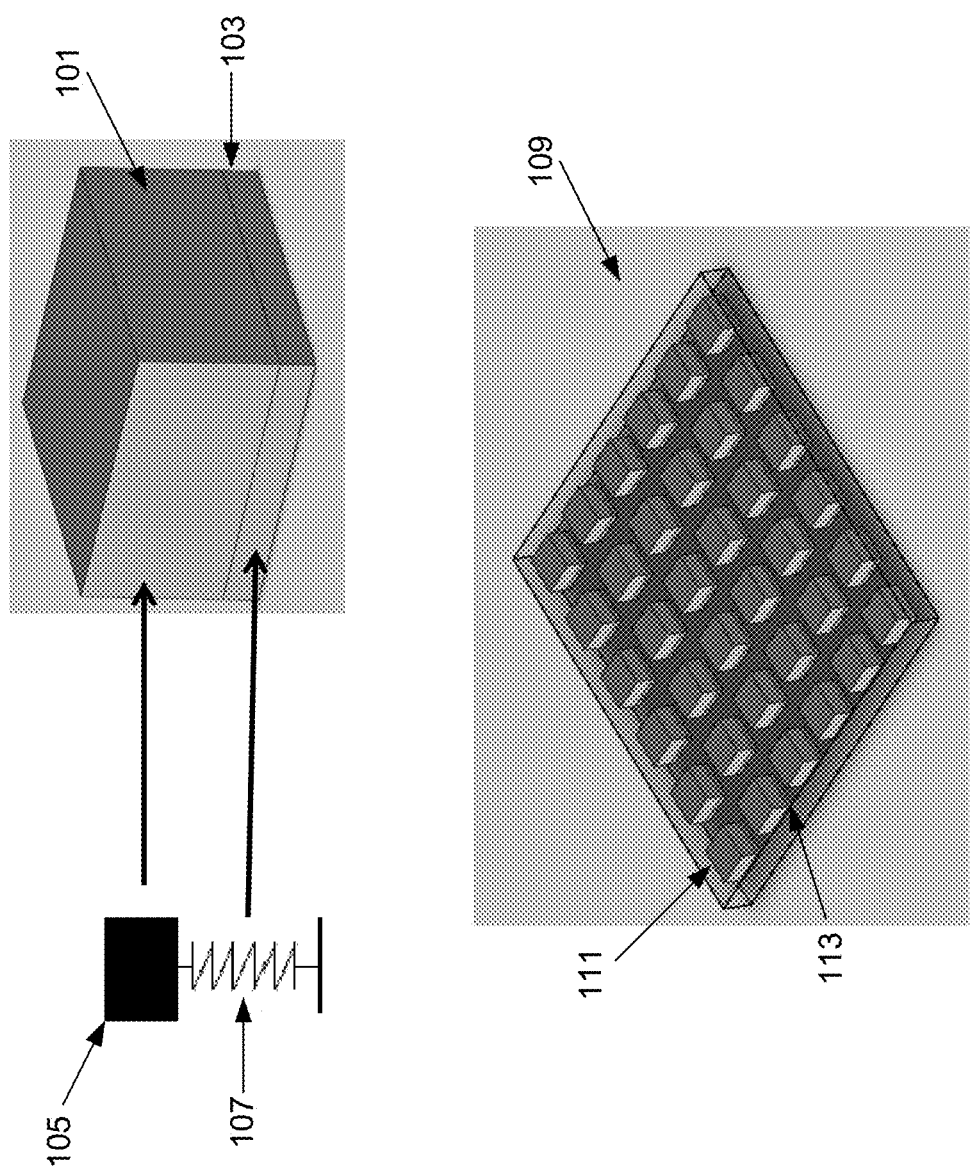
FIG. 1 is a drawing illustrating a vibration absorbing structure, in accordance with an example embodiment of the disclosure.

FIG. 1 is a drawing illustrating a vibration absorbing structure, in accordance with an example embodiment of the disclosure. Referring to FIG. 1, there is shown a dense material 101 adjacent to a softer material 103. In terms of physical vibrations, this structure may be represented by a mass 105 for the dense material 101 and a spring 107 for the softer material 103. Such a structure may be formed in an array, illustrated by the array 109 of mass elements 111 on the soft material layer 113. While the mass elements 111 are shown as cubic structures, the disclosure is not so limited. For example, the mass elements may be spherical, conical, or pyramidal in shape.

The array 109 may act as a vibration absorbing structure for the package in which it is integrated, and may be attached to a leadframe, for example, in a semiconductor package. The array 109 may dampen vibrations by extracting energy from the motion imparted to the structure. For example, the array 109 may be integrated within an integrated circuit package. In instances where the package is exposed to vibration, such as in the normal use of a cell phone or a package in a motor vehicle, for example, the mass elements 111 in the array 109 may absorb the mechanical energy and vibrate themselves, such that vibration energy is directed away from the integrated circuits in operation.

Various techniques may be utilized to manage vibration in a structure. First, structural stiffening may be used to push the fundamental resonance frequency of the structure above that of the primary source or sources of excitation. This may be analogized to more solid and substantial legs on a table, and may be applied to integrated circuit packages with stronger leads, as shown in FIGS. 6-9.

Second, vibration isolation may be used to reduce stress on a structure caused by vibration. This may comprise a spring-like interface placed between a fixed source of vibration and the supporting structure. This attenuates the vibration before it enters the structure. An example of this type of this technique is spring-loaded feet in a phonograph turntable.

Finally, vibration dampening may reduce vibration intensity by absorbing energy from the mechanical energy of the vibration. For example, fluid viscous dampers or tuned-mass dampers may absorb vibration energy, as illustrated by the integrated dampening structures shown in FIGS. 1-5.

Figure 2:
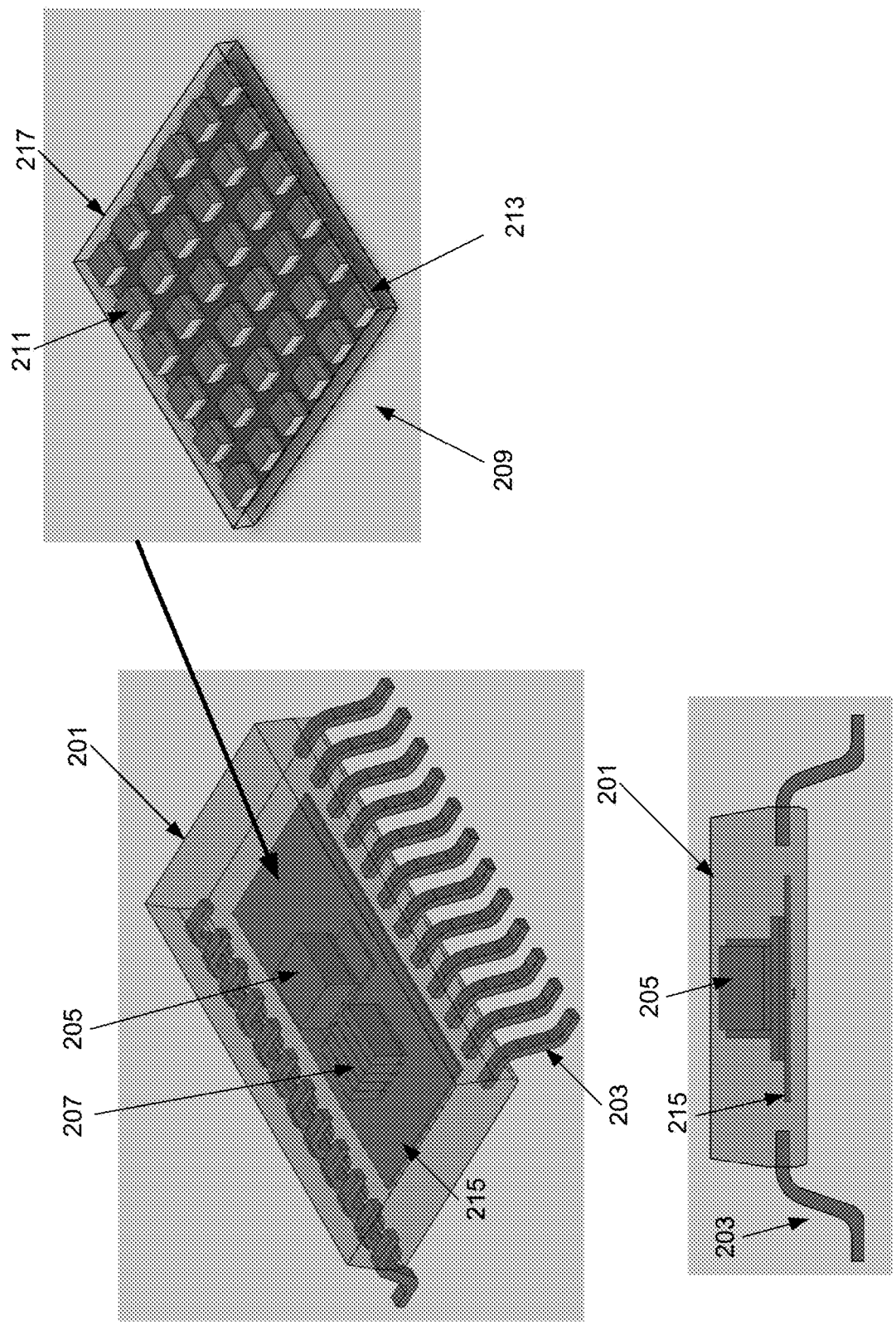
FIG. 2 is a drawing illustrating an array of vibration absorbing structures in an integrated circuit package, in accordance with an example embodiment of the disclosure.

FIG. 2 is a drawing illustrating an array of vibration absorbing structures in an integrated circuit package, in accordance with an example embodiment of the disclosure. Referring to FIG. 2, there is shown the integrated circuit (IC) package 201 comprising a leadframe 215 with an array 209 of mass elements 211 formed on a softer material layer 213 and within encasing material 217, thereby forming a closed "box" vibration absorbing structure. There is also shown an integrated circuit 205, leads 203, and discrete devices 207.

In an example scenario, the array 209 may act as a vibration absorbing structure in the IC package 201, and may be attached to the leadframe 215, that may be used to form the leads 203, for example. The array 209 may dampen vibrations by extracting energy from motion imparted to the IC package 201.

The array 209 may be placed on the leadframe 215 prior to molding, and since the array 209 comprises a closed box vibration absorbing structure, the leadframe 215 may be molded including the boxed array 209 as well. The array may be placed on top, bottom, or both surfaces of the leadframe 215, and may be encased within the package 201 or may be exposed to the exterior of the package, for example in applications where the encapsulant is not formed on the bottom surface of the leadframe 215 thereby exposing the array placed on the bottom surface of the leadframe 215. In another example scenario, a hole or window may be formed in the package 201 exposing the array 209.

Figure 3:
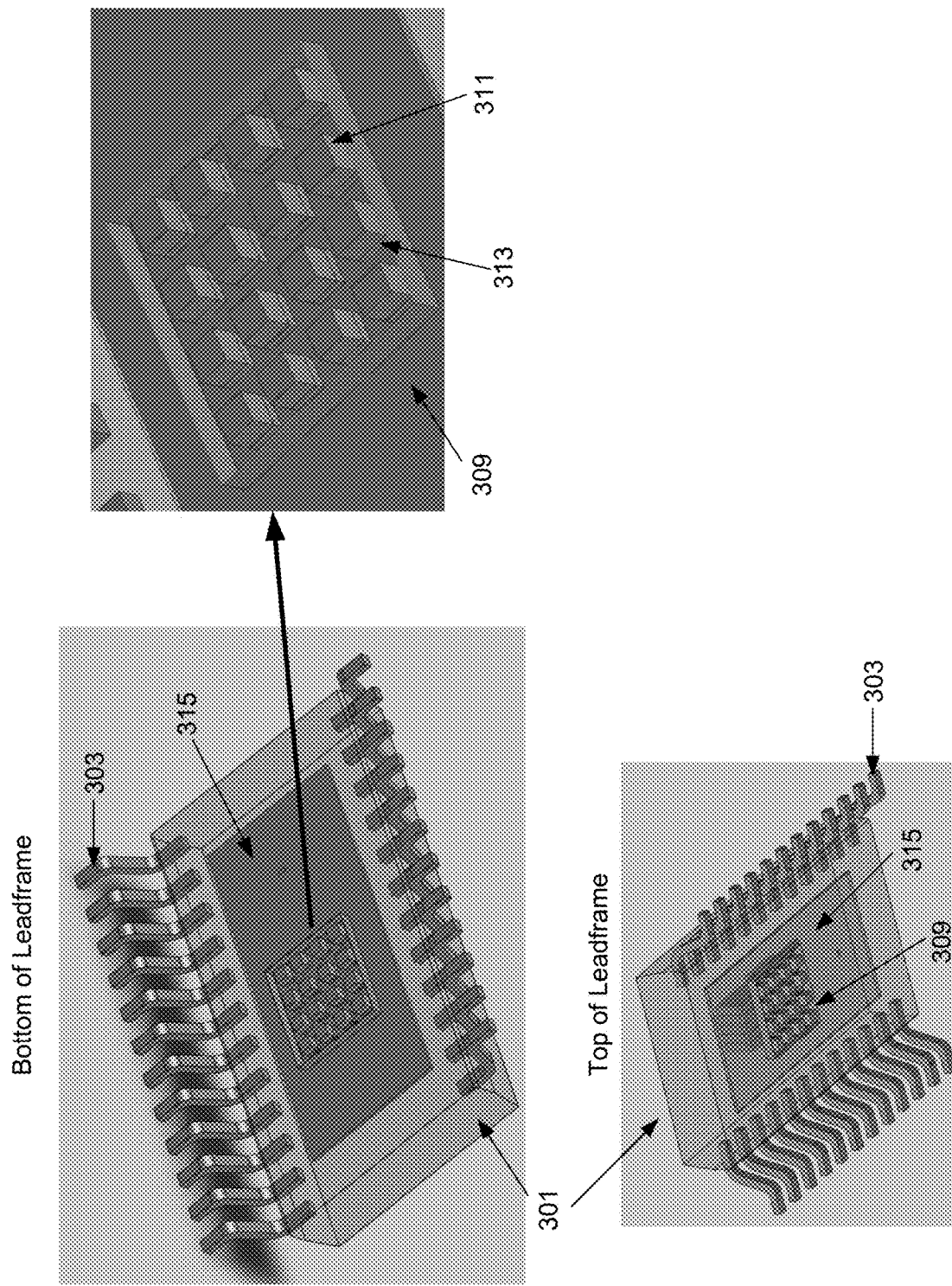
FIG. 3 is a drawing illustrating another arrangement for a vibration absorbing structure, in accordance with an example embodiment of the disclosure.

FIG. 3 is a drawing illustrating another arrangement for a vibration absorbing structure, in accordance with an example embodiment of the disclosure. Referring to FIG. 3, there is shown various views of a dampening array 309 integrated in the IC package 301. As with the array 209, the array 309 comprises an array of mass elements 311 formed on a softer material layer 313 on the leadframe 315, thereby forming a vibration absorbing structure for the IC package 301.

The array 309 may be formed on top or on bottom of the leadframe 315, as illustrated by the views on the left side of FIG. 3, although the disclosure is not so limited. Accordingly, the array 309 may be formed on entire surfaces, portions of surfaces, in symmetric patterns on both sides, or on one or more sides of an IC die, micro-electro-mechanical systems (MEMS) device, or application specific integrated circuit (ASIC) integrated in the package 301. Furthermore, the array 309 may be formed in an open cavity as opposed to being fully encapsulated in the IC package 301 or exposed via a window or hole in the encapsulant, for example.

In an example scenario, the array 309 may act as a dampening mechanism, or absorbing structure, for vibrations in the IC package 301, and may be attached to one or more surfaces of the leadframe 315, that may be used to form the leads 303, for example. The array 309 may dampen vibrations by extracting energy from motion imparted to the IC package 301 and may configure the natural resonance frequencies of the IC package 301. This may both decrease the vibration intensities and configure the resonance frequencies to fall within a desired or specified frequency range.

Figure 4:
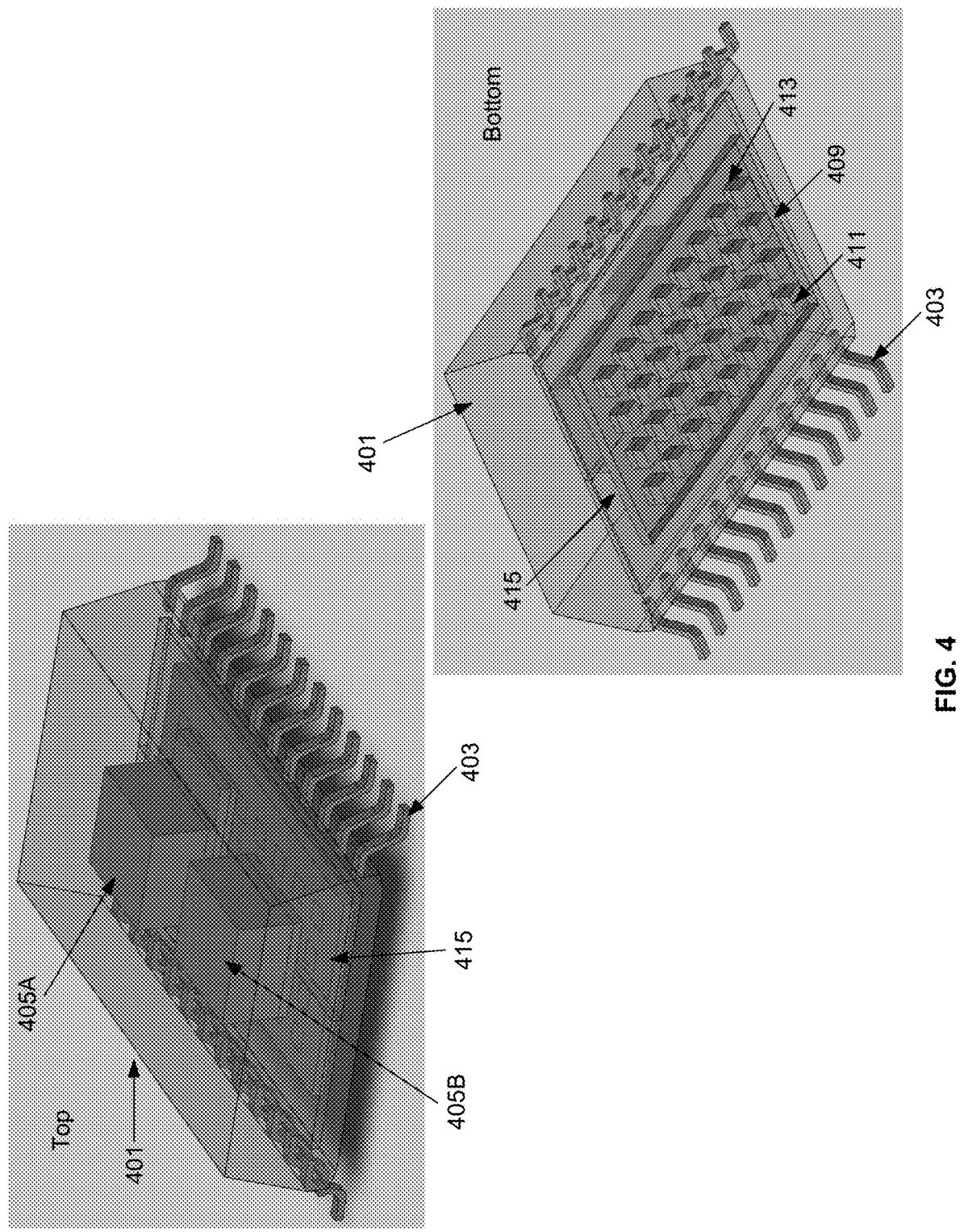
FIG. 4 is drawing illustrating another arrangement for a vibration absorbing structure, in accordance with an example embodiment of the disclosure.

FIG. 4 is drawing illustrating another arrangement for a vibration absorbing structure, in accordance with an example embodiment of the disclosure. Referring to FIG. 4, there is shown various views of a dampening array 409 integrated in the IC package 401. As with the array 209 and 309, the array 409 may comprise an array of mass elements 411 formed on a softer material layer 413 on the leadframe 415, thereby forming a vibration absorbing structure, for the IC package 401.

There is also shown IC die 405A and 405B, which may comprise ASICs, MEMS devices, or discrete components, for example. The array 409 may be formed at most of the area below the IC die 405A and 405B, as shown in FIG. 4, although the disclosure is not so limited. Accordingly, the array 409 may be formed on entire surfaces, portions of surfaces, in symmetric patterns on both sides, or on one or more sides of an IC die, micro-electro-mechanical systems (MEMS) device, or application specific integrated circuit (ASIC) integrated in the package 401. Furthermore, the array 409 may be formed in an open cavity as opposed to being fully encapsulated in the IC package 401.

In an example scenario, the array 409 may act as a dampening mechanism, or absorbing structure, for vibrations in the IC package 401, and may be attached to one or more surfaces of the leadframe 415, that may be used to form the leads 403, for example. The array 409 may dampen vibrations by extracting energy from motion imparted to the IC package 401 and may also configure the resonance frequencies to fall within a desired or specified frequency range.

Figure 5:
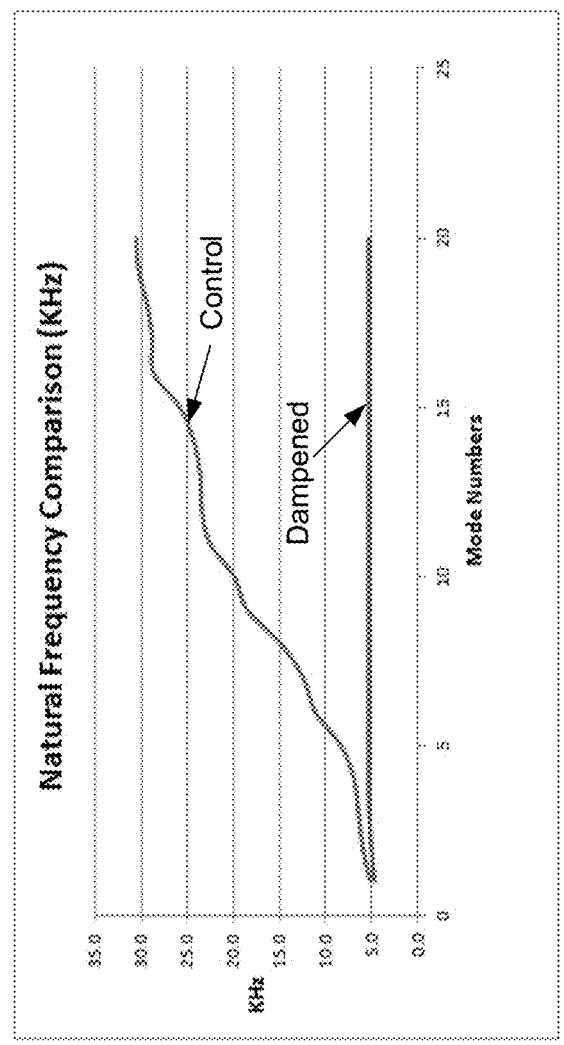
FIG. 5 is a drawing illustrating modeling results for an integrated vibration absorbing structure, in accordance with an example embodiment of the disclosure.
Figure 5:
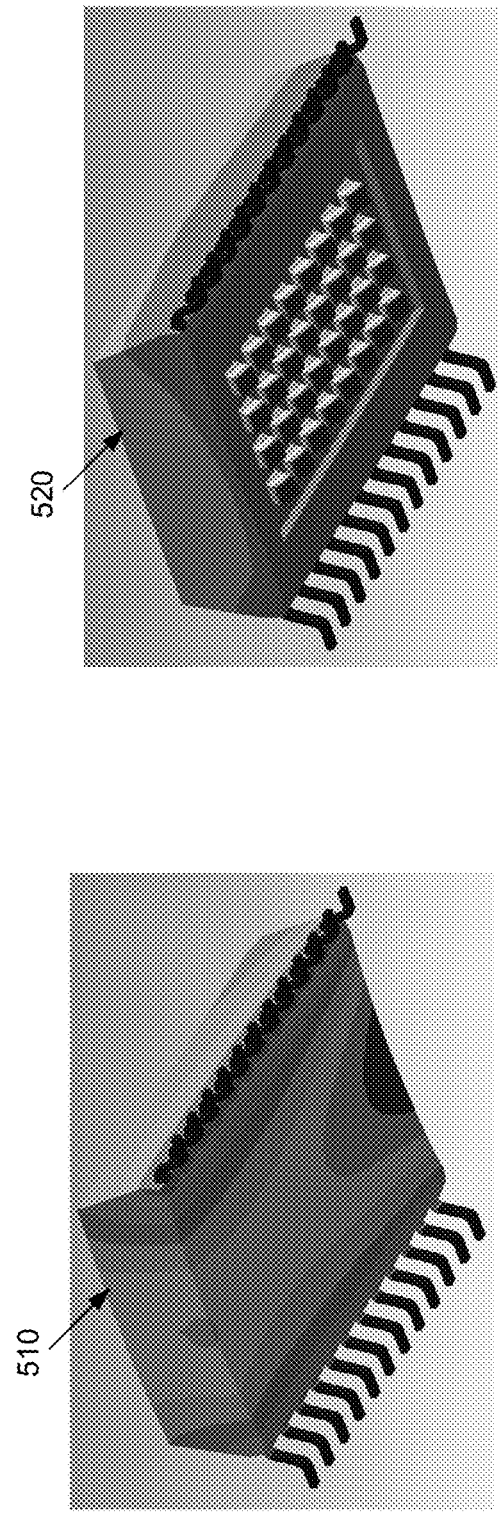

FIG. 5 is a drawing illustrating modeling results for an integrated vibration absorbing structure, in accordance with an example embodiment of the disclosure. Referring to FIG. 5, there is shown a conventional package 510 and a package 520 with an integrated vibration absorbing structure comprising an array of mass elements on softer material layers. The natural frequency of the conventional package 510 is labeled as "Control" in the frequency plot, while the integrated absorbing structure package 520 is labeled as "Dampened." As shown in the frequency plot, the natural frequency of the conventional package 510 increases with mode number, increasing to approximately 30 kHz for mode number 20, whereas the natural frequency of the integrated vibration absorbing structure package 520 shows a flat natural frequency of 5 kHz for all modes 1-20.

The shading in the oblique views of the conventional package 510 and the integrated vibration absorbing structure package 520 shows where the strain from vibration energy is absorbed. In the conventional package 510, the darker shading shows large amounts of vibration energy in the package near the center at one edge. However, in the integrated vibration absorbing structure package 520, the dark shaded regions are confined to the absorbing structure with very little vibration strain in the remaining regions of the package.

Figure 6:
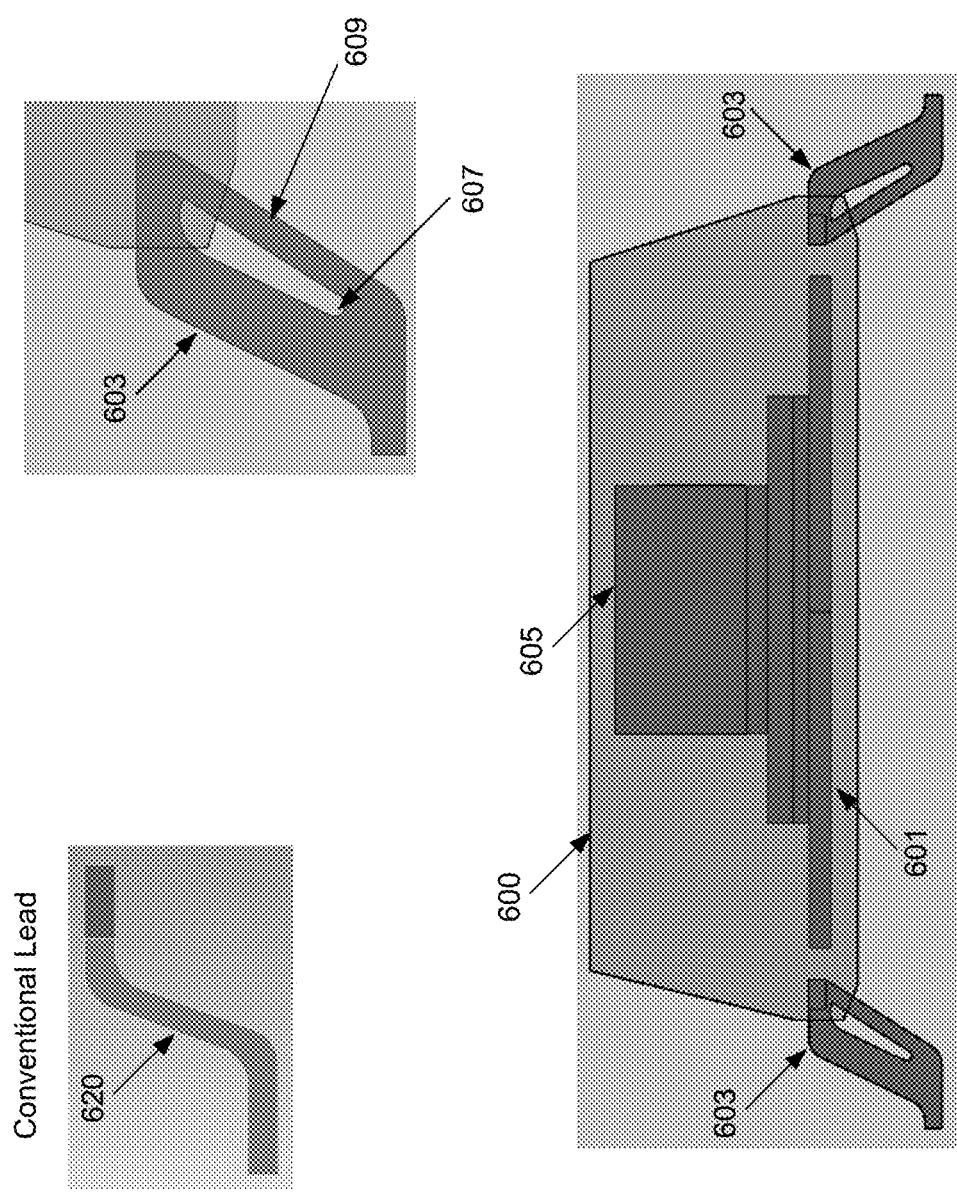
FIG. 6 is a drawing illustrating vibration control through stiffened (e.g., supported) package leads, in accordance with an example embodiment of the disclosure.

FIG. 6 is a drawing illustrating vibration control through stiffened package leads, in accordance with an example embodiment of the disclosure. Referring to FIG. 6, there is shown an IC package 600 comprising a leadframe 601, supported leads 603, and an integrated device 605. There is also shown, in the upper figures, a conventional lead 620 and the supported lead 603.

As seen in FIG. 6, the supported lead 603 comprises a hole 607, resulting in a biaxial lead structure, with the added structure of the support 609, resulting in enhanced rigidity, reducing the vibrations transmitted to the package 600. This enhanced stiffness from the support 609 pushes the fundamental resonance frequency of the package higher (e.g., above the primary sources of excitation).

The natural frequency of a structure is a function of the stiffness and mass given by the relation $$\omega = \sqrt{\frac{k}{m}}$$

Where k is the stiffness and m is the mass. The supported leads 603 shown in FIG. 6 increase k, or stiffness, and enable configuration of the natural frequency of the package without any modifications required to the package itself.

Figure 7:
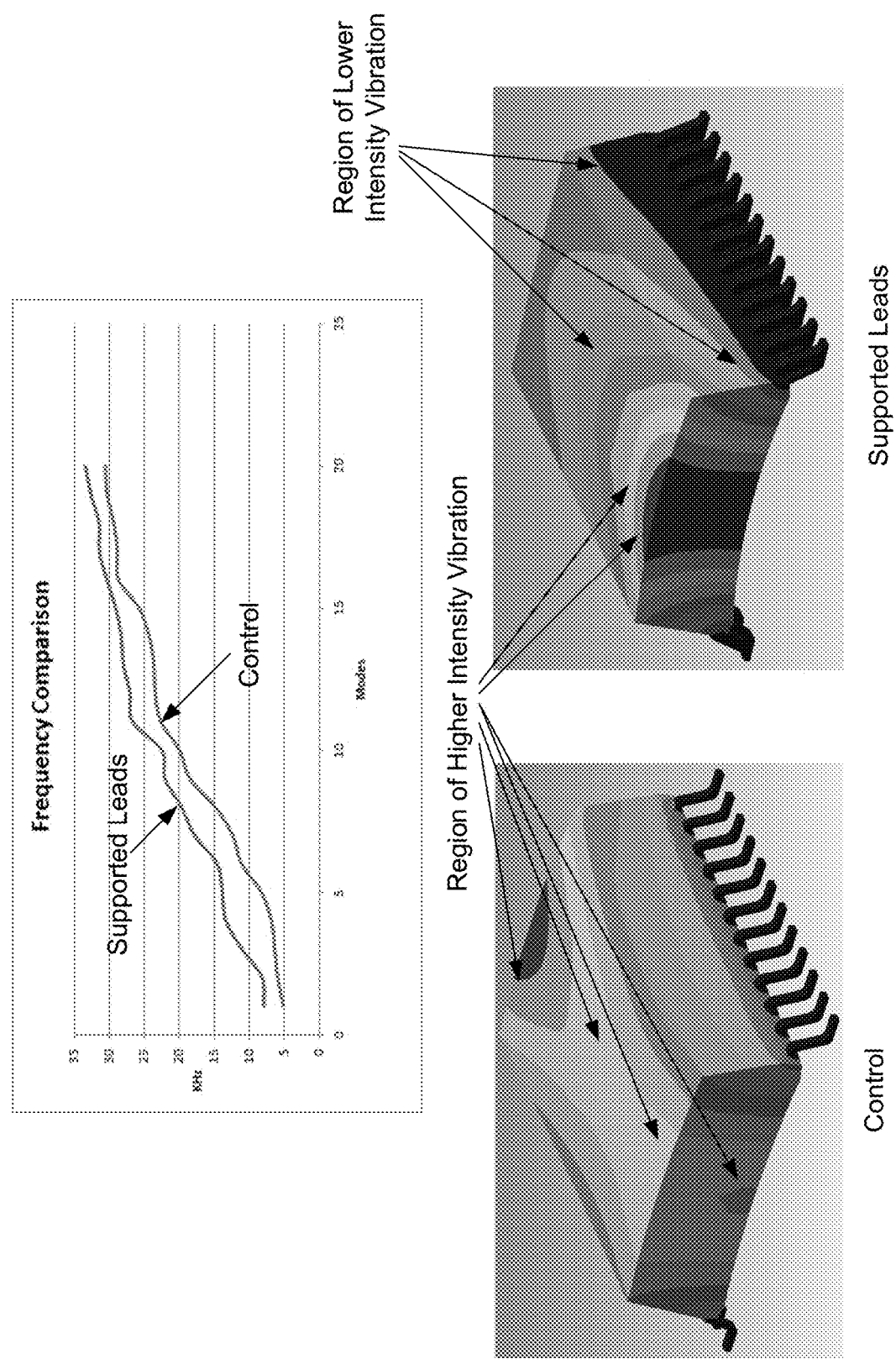
FIG. 7 is a drawing illustrating modeling results for a conventional package and a package with supported leads, in accordance with an example embodiment of the present disclosure.

FIG. 7 is a drawing illustrating modeling results for a conventional package and a package with supported leads, in accordance with an example embodiment of the present disclosure. Referring to FIG. 7, there is shown images of modeling results, the upper figure showing a graph of natural frequency of a conventional package, labeled as "Control" and a supported lead package, labeled as "Supported Leads." As shown in the graph, the natural frequency is increased significantly for all modes.

The lower oblique views show graphical representations of the vibration intensities of the package geometries, with the supported leads structure showing only a localized higher intensity vibration, whereas the control structure has relatively high vibration intensity throughout the structure. Furthermore, the addition of stiffer leads provided by the two-legged structure may not necessarily reduce a vibration intensity of a given mode or frequency, but may shift the natural frequencies of the package as required by a device standard or specification.

Thus, by utilizing vibration absorbing structures and supported leads, the natural resonance frequencies as well as vibration intensities of semiconductor packages may be configured.

Figure 8:
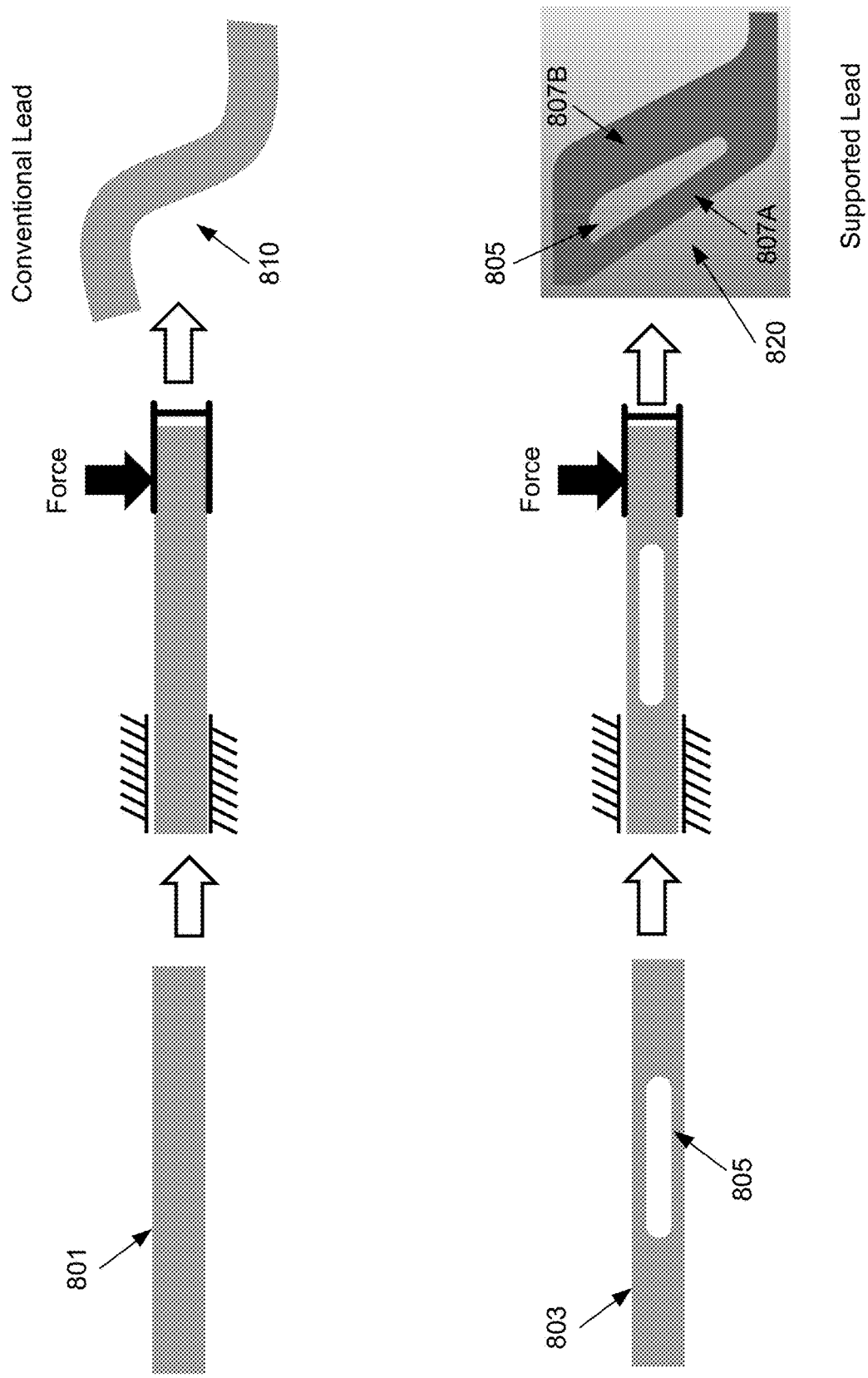
FIG. 8 illustrates fabrication processes for conventional leads and supported leads, in accordance with an example embodiment of the disclosure.

FIG. 8 illustrates fabrication processes for conventional leads and supported leads, in accordance with an example embodiment of the disclosure. Referring to FIG. 8, there is shown a conventional lead 810 and a supported lead 820, which may also be referred to as a supported gull wing lead.

For a conventional lead, source metal 801 may be supported at one end while force is applied at the other end. In this manner, the source metal 801 is formed into a conventional lead 810.

In an example scenario, a source metal 803 may comprise a hole 805 so that the source metal has two separate horizontal legs. It should be noted that the thicknesses of the legs are for illustration purposes only and do not indicate the actual thickness of each leg, as this may be dictated by packaging standards or specifications, for example. When the source metal 803 is supported at one end and a force is applied at the other end, as shown in the middle figure on bottom, a supported lead 820 with two legs 807A and 807B may result, as shown in the lower right figure. The stiffness improvement, and thus configuration of the package natural resonance frequencies, from incorporating supported leads may be configured with varying thicknesses for the legs 807A and 807B.

The supported lead structure 820 with legs 807A and 807B may result in increased stiffness, increasing the natural resonance frequency of the package utilizing the supported lead 820.

Figure 9:
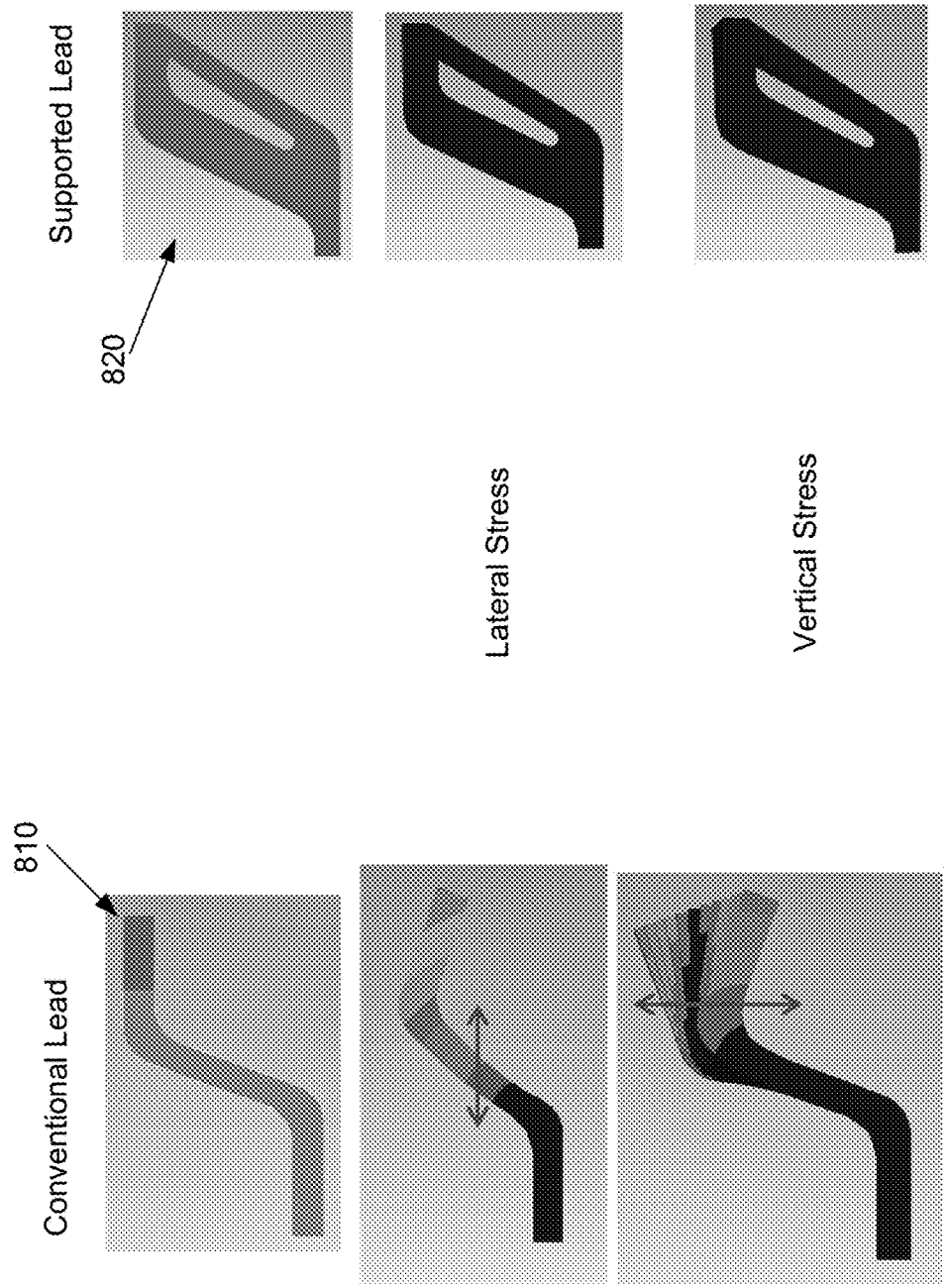
FIG. 9 illustrates modeled strain results for a conventional lead and a supported lead, in accordance with an example embodiment of the disclosure.

FIG. 9 illustrates modeled strain results for a conventional lead and a supported lead, in accordance with an example embodiment of the disclosure. Referring to FIG. 9, there is shown a conventional lead 810 and a supported lead 820, with the top row showing the leads before stress is applied. The middle row shows the conventional lead 810 and the supported lead 820 subject to lateral stress. The conventional lead 810 shows excessive strain resulting in some deformation of the lead whereas the supported lead 820 does not suffer from such deformation.

Similarly, the bottom row shows the conventional lead 810 and the supported lead 820 subject to vertical stress. As before, the conventional lead 810 shows excessive strain resulting in some deformation of the lead, whereas the supported lead 820 does not show any deformation.

In an embodiment of the disclosure, methods and apparatus are disclosed for an embedded vibration management system and may comprise fabricating a semiconductor package with integrated vibration management, where the fabricating comprises: forming an array of vibration absorbing structures; placing the array of vibration absorbing structures proximate to a leadframe comprising two-legged supported leads; placing a semiconductor device above the leadframe; and encapsulating the semiconductor device and the leadframe.

Each vibration absorbing structure may comprise a mass element formed on a material with lower density than the material of the mass element. The array of vibration absorbing structures may be placed on a top surface, on a bottom surface or both the top and bottom surface of the leadframe. Sections of the array of vibration absorbing structures may be placed symmetrically with respect to the semiconductor device. The vibration absorbing structures may be cubic in shape.

The vibration absorbing structures may be enclosed in an encapsulating material. The two-legged supported leads may be formed by bending metal strips with holes. The vibration absorbing structures may be exposed to the exterior of the semiconductor package.

While the disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:

1. A semiconductor package comprising:
    a base structure;
    a first semiconductor device on a top side of the base structure;
    electrical contacts for electrically connecting the semiconductor package to another component;
    an encapsulating material that bounds at least a portion of the first semiconductor device;
    an array of vibration absorbing structures, different from the electrical contacts of the semiconductor package, under a bottom side of the base structure; and
    an encasing material, separate from the encapsulating material, that contacts and laterally surrounds the array of vibration absorbing structures,
    wherein the first semiconductor device comprises a bottom side that is coupled directly to the top side of the base structure.

2. The semiconductor package of claim 1, wherein the encasing material laterally surrounds an entirety of the array of vibration absorbing structures.

3. The semiconductor package of claim 1, wherein the encapsulating material contacts and laterally entirely encapsulates the encasing material.

4. The semiconductor package of claim 1, wherein:
the array of vibration absorbing structures comprises a multi-dimension array of more than four vibration absorbing structures; and
each vibration absorbing structure of the multi-dimensional array of vibration absorbing structures has a rectangular horizontal cross-section.

5. The semiconductor package of claim 1, wherein:
the semiconductor package has a first natural frequency at five modes of vibration;
the semiconductor package has a second natural frequency at ten modes of vibration; and
the second natural frequency is less than ten KHz different from the first natural frequency.

6. The semiconductor package of claim 1, wherein a bottom end of a first electrical contact of the electrical contacts is lower than a bottom end of a first vibration absorbing structure of the array of vibration absorbing structures.

7. The semiconductor package of claim 1, comprising:
a substrate; and
a second semiconductor device laterally displaced from the first semiconductor device,
wherein a bottom end of the second semiconductor device is closer to the substrate than a bottom end of the first semiconductor device.

8. A semiconductor package comprising:
a base structure;
a first semiconductor device on a top side of the base structure;
electrical contacts for electrically connecting the semiconductor package to another component; and
an array of vibration absorbing structures, different from the electrical contacts of the semiconductor package, under a bottom side of the base structure;
a substrate to which the array of vibration absorbing structures is attached and
a first material directly coupled to the array of vibration absorbing structures,
wherein:
the first semiconductor device comprises a bottom side that is coupled directly to the top side of the base structure;
the base structure is above the substrate and between the first semiconductor device and the array of vibration absorbing structures;
the first material is softer than at least one material of the vibration absorbing structures; and
all lateral volume between the vibration absorbing structures is filled with the first material.

9. A semiconductor package comprising:
a base structure;
a semiconductor device on a top side of the base structure;
electrical contacts for electrically connecting the semiconductor package to another component; and
an array of vibration absorbing structures, which do not provide an electrical connection between the semiconductor device and any other electronic component;
an encapsulating material that bounds at least a portion of the semiconductor device; and
an encasing material, separate from the encapsulating material, that contacts and laterally surrounds the array of vibration absorbing structures,
wherein each of the vibration absorbing structures comprises a stacked structure comprising a first material coupled to a second material that is softer than the first material.

10. The semiconductor package of claim 9, wherein the array of vibration absorbing structures is under a bottom side of the base structure.

11. The semiconductor package of claim 9, wherein the base structure comprises a lead frame.

12. The semiconductor package of claim 9, wherein the encasing material laterally surrounds an entirety of the array of vibration absorbing structures.

13. The semiconductor package of claim 9, wherein the semiconductor device comprises a Micro-Electrical-Mechanical System (MEMS) device.

14. The semiconductor package of claim 9, wherein the semiconductor package has a natural frequency that is substantially constant through at least five different numbers of vibration modes in a range of one mode of vibration to twenty modes of vibration.

15. A semiconductor package comprising:
a base structure;
a semiconductor device on a top side of the base structure;
a plurality of electrical contacts for electrically connecting the semiconductor package to another component;
an array of vibration absorbing structures, wherein each vibration absorbing structure of the array of vibration absorbing structures comprises a mass element having a mass element density and coupled to a layer of material having a density lower than the mass element density;
a substrate; and
a filler material,
wherein:
the array of vibration absorbing structures is between the base structure and the substrate;
the filler material is softer than the mass element of the vibration absorbing structures; and
all lateral volume between the vibration absorbing structures is filled with the filler material.

16. The semiconductor package of claim 15, wherein the filler material laterally surrounds the array of vibration absorbing structures.

17. The semiconductor package of claim 16, wherein each of the mass elements is coupled to the layer of material at only one end of said each of the mass elements.

18. The semiconductor package of claim 15, wherein the layer of material is positioned vertically between the array of vibration absorbing structures and the base structure.

19. The semiconductor package of claim 15, wherein a natural frequency of the semiconductor package changes less than 10% through any five consecutive numbers of modes of vibration in a range of one mode of vibration to twenty modes of vibration.

20. The semiconductor package of claim 15, wherein the layer of material comprises a plurality of separate elements.

* * * * *